US005486734A

United States Patent [19]

Seyed-Bolorforosh

[11] Patent Number: 5,486,734

[45] Date of Patent: Jan. 23, 1996

[54] ACOUSTIC TRANSDUCER USING PHASE SHIFT INTERFERENCE

[76] Inventor: Mir S. Seyed-Bolorforosh, 1704 Oak Creek Dr., Apt. 307, Palo Alto, Calif. 94309

[21] Appl. No.: 382,829

[22] Filed: Feb. 3, 1996

Related U.S. Application Data

[63] Continuation of Ser. No. 198,727, Feb. 18, 1994, abandoned.

[51] Int. Cl.[6] .......... H01L 41/08

[52] U.S. Cl. .......... 310/327; 310/322

[58] Field of Search .......... 310/322, 327, 310/334

[56] References Cited

U.S. PATENT DOCUMENTS

| | | | |
|---|---|---|---|
| 4,507,582 | 3/1985 | Glenn | 310/327 |
| 4,751,420 | 6/1988 | Gebhardt et al. | 310/327 |
| 4,800,316 | 1/1989 | Ju-Zhen | 310/327 |

FOREIGN PATENT DOCUMENTS

| | | | |
|---|---|---|---|
| 0005857 | 12/1979 | European Pat. Off. | 310/334 |

OTHER PUBLICATIONS

Hossack, J. A., et al., "Multiple Layer Transducers for Broadband Applications," *1991 Ultrasonics Symposium*, IEEE, pp. 605–610.

*Primary Examiner*—Thomas M. Dougherty

[57] ABSTRACT

A transducer device includes delay sections for creating a phase differential of acoustic waves. The delay sections are spaced apart by sections having an absence of delay. In a preferred embodiment, the phase differential is 180°, so that constructive and destructive interference of pressure waves function occurs to reduce the ringdown time of the transducer device. In the preferred embodiment, the array of delay sections is at the back surface of a piezoelectric element. However, delay sections may be at the front, radiating surface of the piezoelectric element for control of the shape of emitted pulses. Vectorial summation of wave energy cancels unwanted energy that is present as a result of reverberations within the transducer device. Alternative delay structures or multiple delay sections can be used to control the transducer impulse response.

11 Claims, 5 Drawing Sheets

ACOUSTIC TRANSDUCER USING PHASE SHIFT INTERFERENCE

CROSS REFERENCE TO RELATED APPLICATION

This is a continuation of copending application Ser. No. 08/198,727 filed on Feb. 18, 1994, now abandoned.

TECHNICAL FIELD

The present invention relates generally to acoustic devices and more particularly to structures for enhancing the performance of a piezoelectric transducer.

BACKGROUND ART

Piezoelectric transducers may be used in a range of applications, including imaging tissues of a human body by electrically exciting an ultrasonic transducer to generate short ultrasonic pulses that are caused to travel into the body. Echoes from the tissues are received by the transducer and are converted into electrical signals. The electrical signals are then amplified and used to form the medical image of the tissues or the anatomy under examination.

One concern in the design and operation of an ultrasonic transducer is minimizing signal ringdown. At the termination of emission of a single acoustic waveform, a radiating surface of the transducer, signal ringdown is manifested as a series of minor acoustic waves. Ringdown is a result of reverberations taking place within the piezoelectric transducer as wave energy reflects off the opposed surfaces of the structure. For example, wave energy that reaches the radiating surface is divided between escaping energy and reflected energy. The degree to which the energy is reflected depends upon the reflection coefficient, which depends on the acoustic impedance match between the piezoelectric element and the medium contacting the piezoelectric element. Conventionally, a matching layer is provided between the piezoelectric element and the load medium, e.g., tissue or water.

Signal ringdown has a number of adverse effects on the performance of the transducer and consequently the imaging system. Perhaps most importantly, reverberations reduce the bandwidth of the device, with a corresponding increase in pulse duration, i.e., ringdown. An increase or decrease in the pulse duration decreases or increases the spatial resolution of a transducer used in an imaging application. It also follows that enhancing the bandwidth will improve the penetration depth into the load medium and the ability to more efficiently receive echoes from greater depths.

Techniques for reducing reverberations within a piezoelectric transducer are known. As previously noted, an acoustic matching layer may be formed at the radiating surface of the piezoelectric material. The matching layer typically has an acoustic impedance between those of the piezoelectric material and the load medium, thereby acting as an intermediate in the transition of impedance to acoustic waves from the piezoelectric material. However, this requires the availability of a suitable material, as well as suitable processing. Another technique is to attach a backing layer at the back surface of the piezoelectric material. The backing layer may be selected to match the impedance of the piezoelectric material and to absorb any wave energy that has been transmitted rearwardly, at the expense of a reduction in sensitivity. While other techniques are known, further improvements in reducing ringdown time are possible, each with their own limitations and increased processing steps.

What is needed is a transducer device that has structure to reduce ringdown time, thereby enhancing performance.

SUMMARY OF THE INVENTION

The present invention provides a reduction in the ringdown time of a transducer device by applying an approach of both minimizing the occurrence of reverberations within the device and providing structure to achieve a cancellation of reverberations that do occur. The acoustic waveform at any position in front of a radiating surface of the transducer is a vectorial summation of the pressure function across the entire radiating surface. The invention utilizes constructive and destructive interference to cancel undesired components of the waveform.

In a preferred embodiment, a backing member is attached to a back surface of a piezoelectric layer to receive rearwardly directed pressure waves. The backing member includes delay sections that function to shift the phase of the waves relative to second sections that are adjacent to the delay sections. In this embodiment, the wave energy is reflected from the rear surface of the backing member (delay section) and returns to the interface of the delay sections and the piezoelectric material. The backing member is a passive structure, i.e. a structure which does not receive an electrical excitation signal. Nevertheless, the phase shift provided by the delay sections in effect tailors the reverberations to cancel undesired wave energy. Any location that is forward of the backing member will exhibit an emitted pressure waveform. The pressure waveform at each location in front of a radiating aperture is the vectorial summation of the pressure function across the entire surface of the transducer.

The arrangement and the geometry of the delay sections and the second sections of the backing member are designed to take advantage of constructive and destructive interference to cancel wave energy that creates ringdown. By controlling the phase of the reflected acoustic waves from the piezoelectric/backing interface, the ringdown time at the output of the transducer device can be significantly reduced.

The ideal situation in the operation of the backing member is one in which a first cycle of a pressure waveform is created by constructive interference to increase the intensity of the first cycle, while subsequent cycles are subject to destructive interference. To best approximate this situation, the product of the total surface area of the delay sections and their reflection coefficient should be equal to the product of the total surface area of the second sections and their reflection coefficient. Wave energy from the two different sections at the back should be 180° out of phase. For example, the delay sections may have a quarter-cycle delay at an operating frequency of the piezoelectric element, so that a selected 180° shift is created by the double passage through the delay sections. Ideally, the width of the delay sections is equal to or larger than one-half wavelength of the operating frequency, but no greater than twice the wavelength. The delay sections and the second sections are preferably arranged in a checkerboard pattern. However, it is noted that non-ideal arrangements and geometries may be utilized while still obtaining a significant improvement in transducer performance.

In a second embodiment, the structure for achieving the interference of wave energy is positioned at the radiating surface of the piezoelectric element. Thus, the cancellation of wave energy occurs only after pressure waves have been transmitted into the medium of interest, e.g., tissue or water. This embodiment provides advantages, but acoustic impedance matching between the transducer and the medium of interest is more difficult. Also, there is a −6 dB drop in peak-to-peak sensitivity for the two-way response.

An advantage of the present invention is that a transducer impulse response is improved by employing the structure in which alternating sections provide a phase differential of pressure waves, wherein the differential is designed for constructive and destructive interference that reduces the ringdown time of wave generation. The reduction in ringdown time results in an increase in bandwidth and an increase in imaging resolution for a given imaging application.

BEST MODE FOR CARRYING OUT THE INVENTION

Figure 1A:
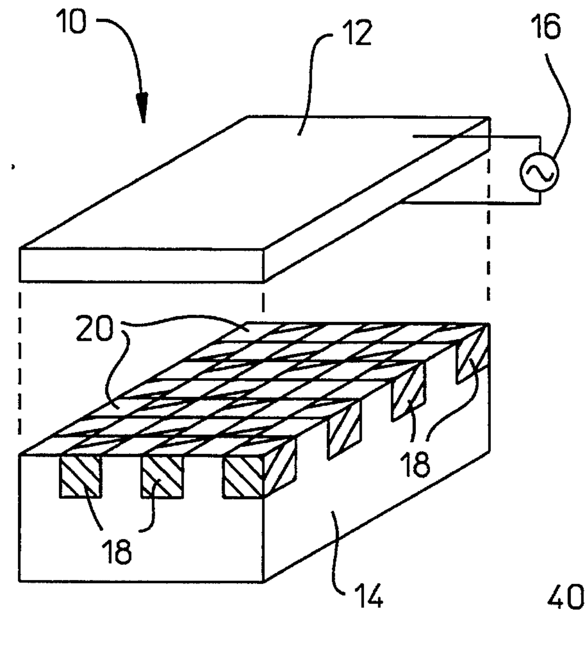
FIG. 1A is a perspective view of a first embodiment of a transducer device having a piezoelectric substrate and a backing member in accordance with the present invention.

With reference to FIG. 1A, a transducer device 10 is shown as including a piezoelectric substrate 12 and a backing member 14. The piezoelectric substrate is a conventional element. The selections of materials and geometries for forming the piezoelectric substrate for a particular application are well understood by persons skilled in the art of designing a transducer device. An acceptable material for forming the piezoelectric substrate for use in medical imaging is lead zirconate titanate (PZT). The thickness of the substrate determines the operating frequency of the transducer device 10.

While the piezoelectric substrate 12 is shown as being a single element, the substrate may be one within an array of elements. Transducer arrays are commonly used in medical imaging. A "piezoelectric element" is defined herein as being a piezoelectric structure having a radiating surface. A single piezoelectric substrate may include a plurality of piezoelectric elements, if channels are formed into a substrate to define isolated radiating surfaces.

A signal source 16 is being shown as connected to a top radiating surface and a bottom, back surface of the piezoelectric element 12. Operation of the signal source generates pressure waves at the operating frequency of the piezoelectric element.

Embedded in the backing member 14 are delay sections 18. The delay sections are made of a material to match the acoustic impedance of the piezoelectric substrate 12. For example, if the piezoelectric material is PZT, the delay sections may be formed of inert PZT, thereby minimizing the reflection coefficient at the interfaces of the delay sections and the back surface of the piezoelectric substrate.

The delay sections are formed to achieve a desired delay relative to second sections 20 that space apart the delay sections. In a preferred embodiment, the delay of wave energy through a delay section is a one-quarter delay of the operating frequency of the piezoelectric substrate. Thus, a pressure wave that passes through a delay section is reflected and passes through the delay section a second time, and will have a 180° phase shift relative to passage of wave energy through second sections having no delay. If the second sections are formed to achieve some delay, the delay sections may be selected to maintain the 180° phase differential.

The improvement provided by the transducer device 10 of FIG. 1A is based upon the arrangement of delay sections 18 and second sections 20, for which the phase differential provides constructive and destructive interference for shortening ringdown time. The backing member 14 reflects ultrasonic pulses in a manner in which the effects of reverberation are cancelled inside the piezoelectric substrate 12. The reduction in ringdown time provides a corresponding increase in the bandwidth of the device 10. It follows that spatial resolution is enhanced with the possibility of improved penetration depth into a medium of interest, such as human tissue or water.

The reduction in ringdown time is a result of the vectorial summation of the pressure function across the entire surface of the transducer 12. As energy is reflected from the backing member, energy from the delay sections 18 and energy from the second sections 20 interfere. The energy at any point forward of the transducer is dependent upon the vectorial summation of the acoustic waves from small elemental sections 26 and 24 of the transducer with or without the delay at the back. Optimally, the elemental sections can be further separated from each other using a dicing operation for total isolation from each other.

Figure 1B:
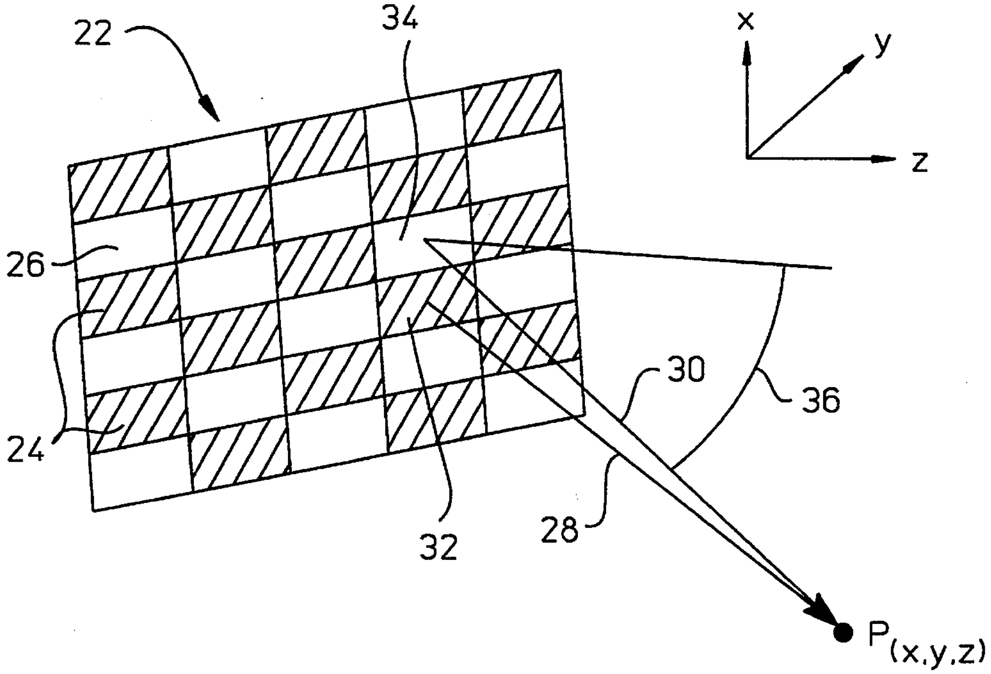
FIG. 1B is a perspective view of a radiating surface having a matrix of delay and undelayed sections in accordance with the present invention.

Referring to FIG. 1B, the forward surface 22 of a radiating aperture with a phase differential member at the back is shown. In effect, the forward surface 22 is a radiating surface. Sections 24 having a delay at the back and sections 26 without the delay at the back emit acoustic waves that are preferably 180° out of phase after the first cycle of the pulse. For any given point forward of the surface 22, the pressure function is the vectorial summation of wave energy from across the entire surface. Lines 28 and 30 represent energy paths from a single delayed elemental section 32 and a single undelayed elemental section 34, respectively, to a point in space in front of the transducer. The vectorial summation is dependent not only upon the lengths of the paths defined by the two lines 28 and 30, but also the angle 36 from the normal to the front surface 22. Each of the elements 32 and 34 may be considered to be a pressure release baffle of the radiating forward surface. The potential at any point in front of the radiators 32 and 34 is given by the Rayleigh-Sommerfeld integral as:

$$\phi(x, y, z) = \frac{jk}{2\pi} \int_S \phi(x', y', 0) \frac{e^{-jkR}}{R} \cos \Phi \, ds,$$

where $\phi(x',y',0)$ is the potential at the surface of the radiator 32 or 34, R is the radius vector indicating the distance away from the radiator, Φ is the angle 36 between the radius vector R and the normal to the plane, and k is the wave number.

The above equation is true assuming that the point of interest in front of a radiating surface is several wavelengths away from the forward surface. In considering a point P that is many wavelengths away from any neighboring radiating elements 32 and 34, then R is the same for the two sources 32 and 34. Therefore, the potential would be the simple summation of the two small sources 32 and 34. By controlling the phase of the acoustic wavefronts from the neighboring sources, the shape of the emitted waveforms in the time domain can be controlled. A similar vectorial summation occurs in a transducer reception mode at the two boundaries inside the active piezoelectric layer. Again, by controlling the phase of the reverberations, the transducer impulse response can be controlled.

The preferred embodiment is one in which the delay sections 18 of FIG. 1A are at the back of the piezoelectric substrate, since in this embodiment there is a constructive interference of the first cycle, and destructive interference of subsequent cycles. However, the matrix of delay regions and undelayed regions can be at the front of the piezoelectric substrate with improvements over prior art transducers. By controlling the phase of the emitted pressure function for the given cycles and for the different sections 24, 26, 32 and 34, the impulse response can be controlled.

In FIG. 1B, two pulses are emitted from the forward surface 22, depending upon the presence or absence of delay sections. Alternatively, more than one type of delay section can be incorporated. That is, delay sections with different delays can be incorporated to tailor the impulse response of a transducer device to achieve the desired results.

In the embodiments of FIG. 1A, the product of the sum of the areas of the delay sections 18 times the reflection coefficient associated with the sections 18 is equal to the product of the sum of the areas of the sections 20 having an absence of delay times the reflection coefficient associated with the sections 20. This is the preferred embodiment, since it achieves the greatest cancellation. However, other possibilities are possible, in order to tailor the vectorial summation to obtain a desired result.

The backing member 14 of FIG. 1A may be formed of materials typically used in fabricating backing layers on a conventional transducer device. For example, a combination of epoxy and tungsten powder may be used. The second sections 20 are an extension of the backing member, but the matrix of delay sections 18 and second sections may be formed and then bonded to the remainder of the backing member 14. The assembled backing member is then bonded to the piezoelectric substrate 12 using conventional techniques. A metallic (conductive) structure is formed on the opposed sides of the piezoelectric substrate 12 to permit electrical communication between the piezoelectric substrate and the signal source 16. Alternatively, the delay sections can be bonded to the piezoelectric substrate 12 and the backing material can then be poured onto the device before setting.

The delay sections 18 of FIG. 1A are shown as being square members arranged in the checkerboard pattern. The width of the delay sections at the backing should be at least as great as one-half wavelength of the operating frequency of the piezoelectric substrate 12, but no greater than two wavelengths. If the sections are too small, the mechanical properties of the inert PZT delay units will be affected, so that the acoustic impedance and the velocity of pressure waves may be different than that of the bulk PZT substrate 12. The total surface area and the length may be weighted to provide compensation. If the sections are too large, the desired interference would only take place at greater depths, further away from the radiating surface.

Figure 2:
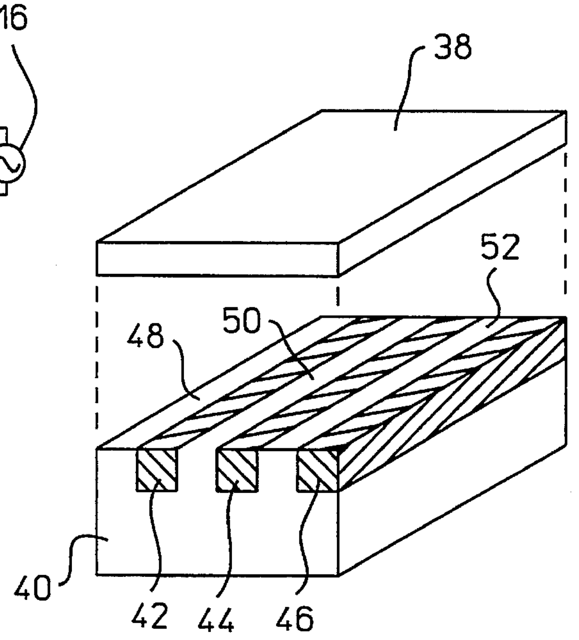
FIG. 2 is a perspective view of a second embodiment of a transducer device having a piezoelectric substrate and a backing member.

A second embodiment of the invention is shown in FIG. 2. In this embodiment, a piezoelectric substrate 38 is shown as being positioned for bonding to a backing member 40 having three delay units 42, 44 and 46. Adjacent to the delay units are units 48, 50 and 52 through which pressure waves are undelayed. The operation of the embodiment of FIG. 2 is identical to that of FIG. 1. Thus, a vectorial summation occurs in front of the radiating surface, which results in cancelling reverberations generated within the transducer device.

Figure 3:
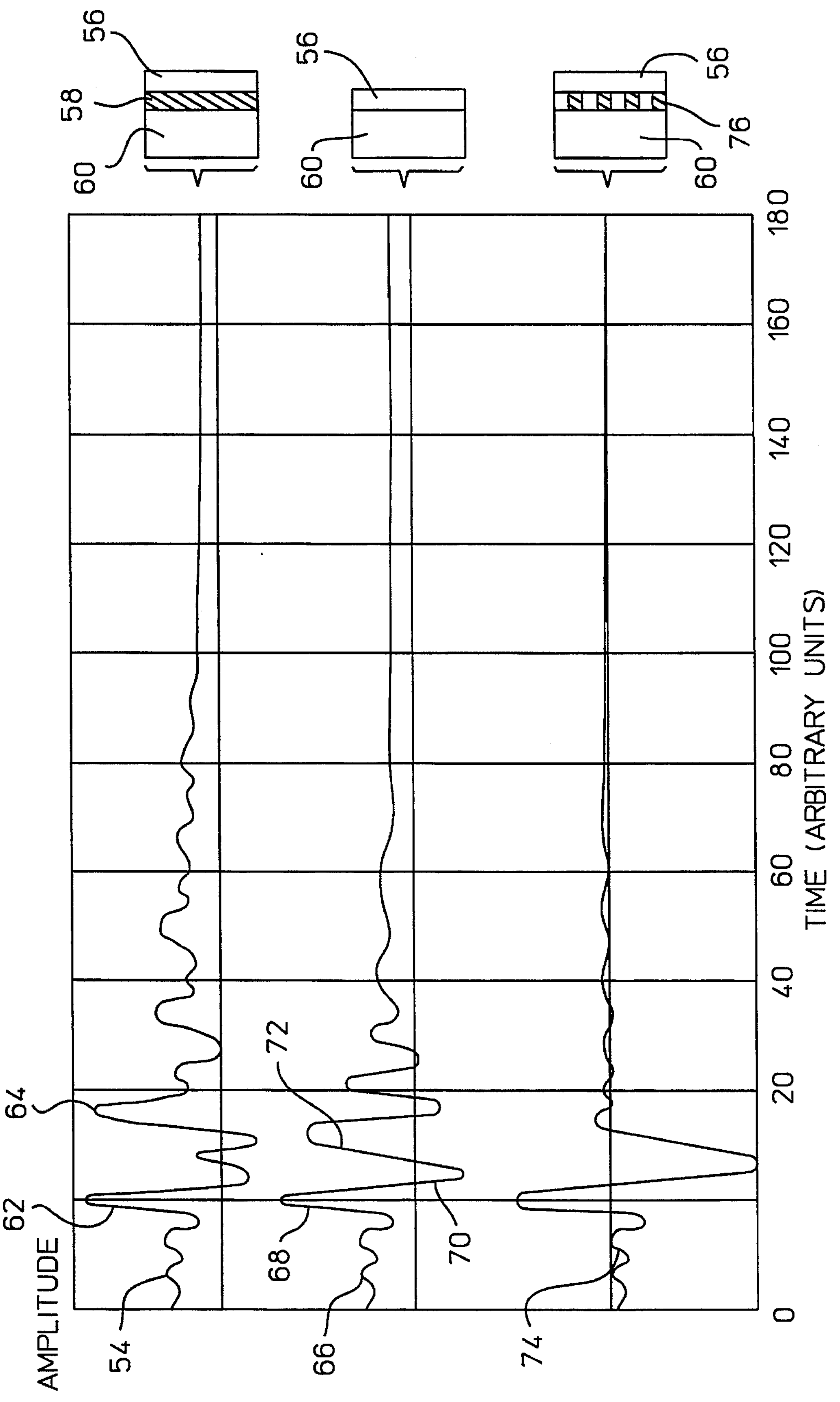
FIG. 3 shows simulated pressure waveforms for a transducer device with a delay, without a delay, and with a matrix of delay and undelayed sections as shown in FIGS. 1A and 1B, wherein no front matching layer is used.

A series of simulations were performed to determine the improvements obtained by means of the transducer device 10 of FIG. 1A. The simulation results correspond to one-way impulse response. In FIG. 3, a first waveform 54 in a time domain is shown for a piezoelectric substrate 56 having a one-quarter wavelength delay unit 58 and a conventional backing layer 60. The piezoelectric substrate 56 is PZT and the one-piece delay unit 58 is inert PZT. The backing layer is a layer having an impedance of approximately 10 MRayl. The thickness of a backing layer 60 is many wavelengths (>20) of the operating frequency of the piezoelectric substrate 56. A first half cycle 62 is wave energy generated in the piezoelectric substrate directly into the water. A second pulse 64 represents energy which was originally directed rearwardly, but which after passing through the delay unit 58 and being reflected, has been radiated into the water.

Figure 4:
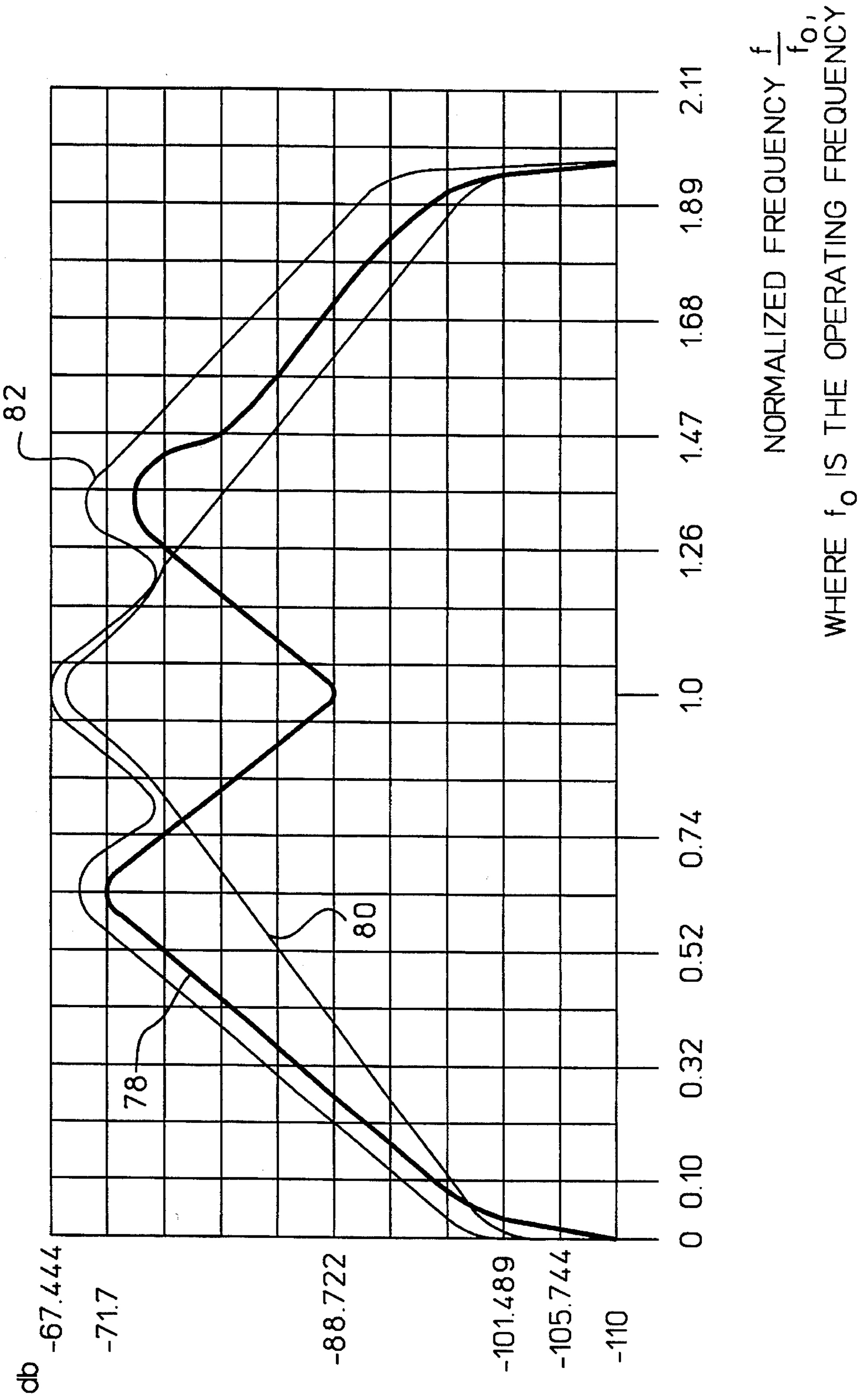
FIG. 4 is a graph of three frequency spectrum responses of the simulated waveforms of FIG. 3.

A center waveform 66 is obtained for the piezoelectric substrate 56 and the backing layer 60 without the delay unit. A first half cycle 68 of energy radiated into the water represents generated wave energy that passes directly from the piezoelectric substrate 56. A second half cycle 70 is energy reflected from the backing layer 60 before being radiated from the transducer device. A third half cycle 72 represents energy that was reflected at the interface of the water and the piezoelectric substrate, was again reflected to a forward position, and radiated into the water. However, not all of the twice-reflected energy is emitted into the water. A percentage is again reflected rearwardly. This reverberation continues until the ringdown time characteristics of the transducer device have passed. The waveform 74 is a vectorial summation of the other two waveforms. An "incoherent" unit 76 is positioned between the piezoelectric substrate 56 and the backing member 60. The incoherent unit includes an alternating pattern of delay sections and sections in which there is an absence of delay. The vectorial summation provides a significant reduction of ringdown time. This is shown in the frequency domain graph of FIG. 4. A plot 78 is obtained for the pressure waveform 54 of the transducer with the delay unit 58. The plot 78 has two peaks separated by a substantial valley.

A second plot 80 was obtained for the time domain waveform 66 of the conventional transducer. A frequency spectrum single, center peak is shown. In comparison, a plot 82 of the time domain waveform 74 for the device having the incoherent unit 76 has three peaks in which valleys are less substantial than the plot 78. The transducer bandwidth is significantly improved. Thus, the ringdown time is reduced with a substantial increase in transducer bandwidth.

Figure 5:
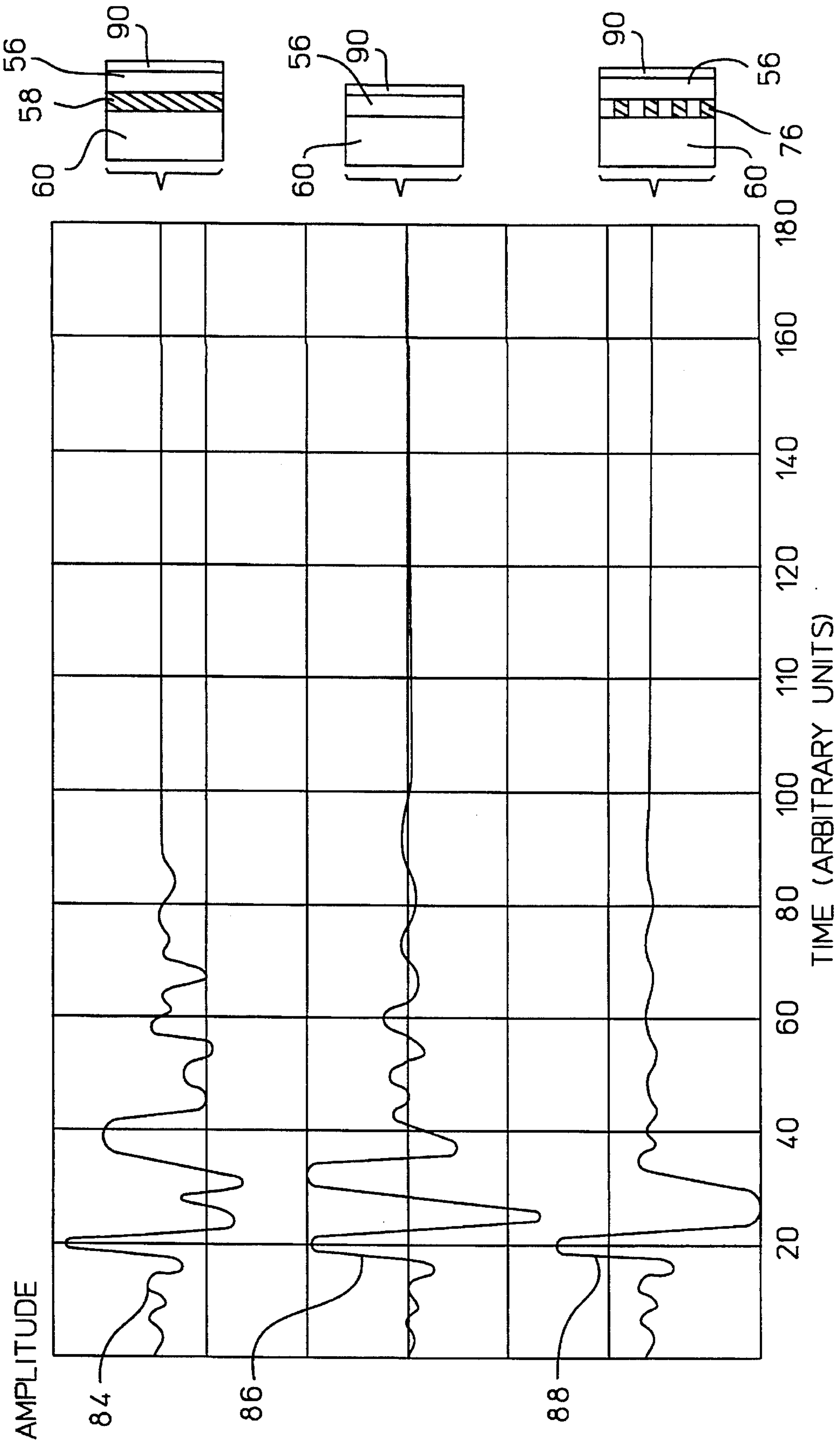
FIG. 5 is a graph of three simulated pressure waveforms similar to FIG. 3, but using a transducer device having a single front impedance matching layer.
Figure 6:
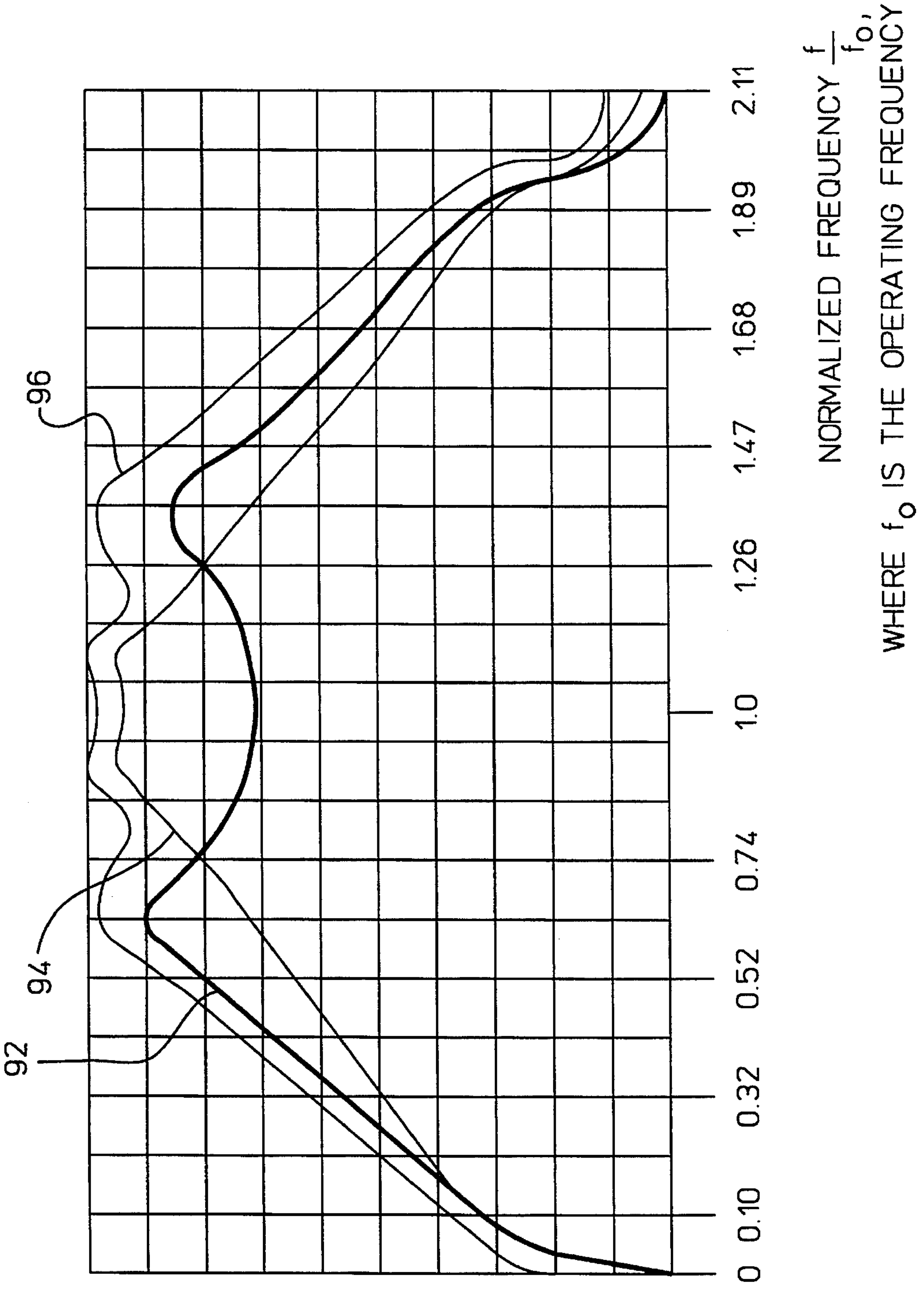
FIG. 6 is a graph of three frequency spectrum responses for the simulated waveforms of FIG. 5.

A similar improvement is shown in FIG. 5. Waveforms 84, 86 and 88 were obtained in the same manner as those of FIG. 3, but a one-quarter wavelength impedance matching layer 90 was employed at the radiating surface of the piezoelectric substrate 56. Ring-down times are significantly reduced. In FIG. 6, the bandwidth is shown as being enhanced. Plots 92, 94 and 96 represent frequency domain waveforms of waveforms 84, 86 and 88, respectively, of FIG. 5.

I claim:

1. A transducer device for transmitting acoustic waves in response to an electrical signal comprising:

a piezoelectric element having first and second surfaces and a first acoustic impedance, and further having an operating frequency; and means having an interface with said first surface for establishing a desired pattern of wave interference for acoustic waves that are originally directed toward said first surface and then redirected toward said second surface;

said means including first and second sections having dissimilar acoustic impedances, said first acoustic impedance being more closely matched to said acoustic impedance of said second sections than to said acoustic impedance of said first sections;

said first and second sections having generally planar proximal sides at said interface with said first surface of said piezoelectric element, said second sections having generally planar distal sides opposite to said proximal sides, each said distal side being parallel to said proximal side and separated therefrom by a distance equal to an integral odd multiple of a one-quarter wavelength of said operating frequency of said piezoelectric element;

whereby said desired pattern of wave interference is formed such that acoustic energy reflected at said proximal sides of said first section is substantially 180° out of phase with respect to acoustic energy reentering said piezoelectric element after being reflected at said distal sides of said second section.

2. The transducer of claim 1 wherein said proximal and distal sides of said second sections have a maximum width of two times a wavelength of said operating frequency.

3. The transducer of claim 1 wherein said proximal sides of said first and second sections at said interface are uniformly sized and define an alternating pattern.

4. The transducer of claim 3 wherein said alternating pattern is a checkerboard pattern of said proximal sides of said first and second sections.

5. The transducer of claim 1 wherein said first sections include a backing layer having a thickness extending from said interface and beyond said distal sides of said second sections, thereby containing said second sections within said backing layer.

6. A transducer device comprising:

a piezoelectric element having an operating frequency;

a backing member having a contact surface and having a rear surface opposite to said contact surface; and a plurality of delay elements embedded within said backing member, each said delay element having a first surface intersecting and being coplanar with said contact surface, thereby dividing said contact surface into areas exposing said backing member and areas exposing said delay elements;

said contact surface being coupled to a side of said piezoelectric element and defining a first generally planar interface between said side of said piezoelectric element in contact with said areas exposing said backing member;

each said delay element being coupled to said backing member at a generally planar second interface defined between said each delay element and said backing member, said second interfaces being parallel to said first interface, said second interfaces further being separated from said first interface by a distance less than a distance between said contact and rear surfaces of said backing member and being substantially equal to an integral odd multiple of a one-quarter wavelength of said operating frequency;

said delay elements having an acoustic impedance that is different than an acoustic impedance of said backing member and that is substantially equal to an acoustic impedance of said piezoelectric element;

whereby a portion of the acoustic energy of acoustic waves directed at said backing member is reflected at said first interface and at said second interfaces, said acoustic energy propagating through said piezoelectric element after being reflected at said first interface being substantially 180° out of phase with respect to said acoustic energy reflected at said second interfaces.

7. The device of claim 6 wherein said delay elements are uniformly sized, each said delay element having a maximum width measurement of two times a wavelength of said operating frequency.

8. The device of claim 6 wherein said delay elements are uniformly spaced apart within said backing member such that said areas exposing said backing member and said areas exposing said delay elements have an alternating pattern.

9. The device of claim 8 wherein said areas exposing said backing member and said areas exposing said delay elements have a uniformly spaced checkerboard arrangement.

10. The device of claim 8 wherein said alternating pattern is an alternating pattern of stripes.

11. The device of claim 6 wherein said delay elements have a maximum width of two times a wavelength of said operating frequency.

* * * * *